United States Patent
Koch et al.

(10) Patent No.: US 11,327,225 B2
(45) Date of Patent: May 10, 2022

(54) OPTICAL PRINTED CIRCUIT BOARD WITH POLYMER ARRAY STITCH

(71) Applicant: Arizona Board of Regents on Behalf of the University of Arizona, Tucson, AZ (US)

(72) Inventors: Thomas L. Koch, Tucson, AZ (US); Robert A. Norwood, Tucson, AZ (US); Stanley K. H. Pau, Tucson, AZ (US); Nasser N. Peyghambarian, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

(21) Appl. No.: 16/094,886

(22) PCT Filed: Apr. 28, 2017

(86) PCT No.: PCT/US2017/030045
§ 371 (c)(1),
(2) Date: Oct. 19, 2018

(87) PCT Pub. No.: WO2017/189955
PCT Pub. Date: Nov. 2, 2017

(65) Prior Publication Data
US 2019/0098751 A1    Mar. 28, 2019

Related U.S. Application Data

(60) Provisional application No. 62/330,003, filed on Apr. 29, 2016.

(51) Int. Cl.
G02B 6/13    (2006.01)
G02B 6/12    (2006.01)

(52) U.S. Cl.
CPC ........... *G02B 6/12002* (2013.01); *G02B 6/13* (2013.01)

(58) Field of Classification Search
CPC .. G02B 6/12; G02B 6/12002; G02B 6/02033; G02B 6/4228; G02B 6/4239; G02B 6/43; H05K 1/0274; H05K 2201/10121
(Continued)

(56) References Cited

U.S. PATENT DOCUMENTS 5,375,184 A    12/1994  Sullivan
6,097,871 A *  8/2000  De Dobbelaere .... G02B 6/1221
                                              385/129

(Continued)

OTHER PUBLICATIONS

"Application of two-photon 3D lithography for the fabrication of embedded ORMOCER waveguides," by Schmidt et al, Proceedings of SPIE, vol. 6476, 64760, 2007.*
(Continued)

*Primary Examiner* — Robert Tavlykaev
(74) *Attorney, Agent, or Firm* — Stuart H. Mayer; Mayer & Williams PC

(57) ABSTRACT

A flexible polymer waveguide array structure serves as a stitch or jumper on an optical printed circuit board (OPCB). The flexible polymer waveguide array structure can be attached to the OPCB so that it can provide a chip-to-OPCB optical connection. The waveguide(s) in the flexible polymer waveguide array structure may be prefabricated before the flexible polymer waveguide array structure is attached to the OPCB. Alternatively, the waveguides may be fabricated after the flexible polymer waveguide array structure has been attached to the OPCB. The waveguide(s) may be subsequently formed using a printing process such as photolithography. As a consequence of forming the waveguide(s) after attachment of the flexible polymer waveguide array to the OPCB, the precision in the lateral align-
(Continued)

ment that is required when placing the flexible polymer waveguide array structure on the OPCB is generally significantly less than is required when the waveguide(s) are prefabricated.

21 Claims, 7 Drawing Sheets

(58) Field of Classification Search
USPC ........ 385/14, 30–32, 50, 129–132, 143, 145
See application file for complete search history.

(56) References Cited

U.S. PATENT DOCUMENTS

| | | | |
|---|---|---|---|
| 6,709,607 B2 | 3/2004 | Hibbs-Brenner et al. | |
| 7,184,617 B2* | 2/2007 | Korenaga | G02B 6/1221 385/14 |
| 7,454,098 B1 | 11/2008 | Lamprecht et al. | |
| 7,794,561 B2* | 9/2010 | Lamprecht | G02B 6/43 156/289 |
| 8,351,752 B2* | 1/2013 | Shibata | G02B 6/1221 385/132 |
| 8,442,368 B1* | 5/2013 | Reano | G02B 6/132 385/39 |
| 2004/0071387 A1 | 4/2004 | Mule | |
| 2004/0184704 A1* | 9/2004 | Bakir | G02B 6/12002 385/14 |
| 2011/0097034 A1* | 4/2011 | Uemura | G02B 6/4249 385/14 |
| 2011/0116741 A1* | 5/2011 | Cevini | G02B 6/1228 385/28 |
| 2012/0020612 A1* | 1/2012 | Ito | G02B 6/4246 385/14 |
| 2012/0224804 A1* | 9/2012 | Hashimoto | H01L 31/02325 385/14 |
| 2013/0223788 A1* | 8/2013 | Koos | G02B 6/30 385/14 |
| 2014/0300877 A1 | 10/2014 | Menon | |
| 2014/0334768 A1* | 11/2014 | Chang | G02B 6/12 385/14 |
| 2016/0131842 A1* | 5/2016 | Mahgerefteh | G02B 6/124 385/11 |
| 2016/0238786 A1* | 8/2016 | Garner | G02B 6/10 |
| 2017/0343733 A1* | 11/2017 | Sutherland | G02B 6/3608 |

OTHER PUBLICATIONS

"UV-written channel waveguides in ion-exchanged Pyrex," by Sheridan et al, Proceedings of European Conference on Integrated Optics, Apr. 2003.*

"Direct-UV-written buried channel waveguide lasers in direct-bonded intersubstrate ion-exchanged neodymium-doped germano-borosilicate glass" by Gawith et al, Appl. Phys. Lett., vol. 81, 3522-3524, 2002.*

* cited by examiner

OPTICAL PRINTED CIRCUIT BOARD WITH POLYMER ARRAY STITCH

CROSS-REFERENCE TO RELATED APPLICATION

This application claims the benefit of U.S. Provisional Ser. No. 62/330,003, filed 29 Apr. 2016 entitled "OPTICAL PRINTED CIRCUIT BOARD WITH POLYMER ARRAY STITCH", which is hereby incorporated by reference in its entirety.

GOVERNMENT FUNDING

This invention was made with government support under Grant No. FA8650-15-2-5220, awarded by Air Force Material Command. The government has certain rights in the invention.

BACKGROUND

An important problem in optical packaging involves the optical interconnection of planar-integrated photonic integrated circuits (chip-chip connections) and the connection of such circuits to the external world. Photonic integrated circuits (PICs) refer to waveguide-based photonic components, including optical integrated devices such as lasers, optical amplifiers, switches, filters, modulators, splitters, phase shifters, variable attenuators, detectors, and the like. PICs can also include integration with semiconductor devices such as CMOS electronic devices. PICs allow systems with high complexity and multiple functions to be integrated on a single substrate to thereby allow the generation, detection, propagation and modulation of both optical and electrical signals. PICs may employ a variety of different material systems, including silicon, silicon nitride, polymer, silicon dioxide, ion-exchange glass, lithium niobate, InP, GaAs, and graphene, and optical interconnection processes should be compatible with these material systems.

In copending patent application Ser. No. 15/764,064, polymer waveguides are used to interconnect optical devices such as PICs. The polymer waveguide is designed to create connections over small distances, such as 1 mm to 10 mm. For optical connections over larger distances (e.g., greater than 10 mm), the polymer waveguide concept in UA16-053 has several disadvantages. If the polymer waveguide is fabricated by a maskless lithography system, the waveguide array likely requires a long exposure time because of the large write areas required. Such a long exposure time may not be practical in a manufacturing setting. While this problem can be addressed by using large-area, mask-based lithography, in addition, polymer waveguides generally have higher losses than on-board glass waveguides. Thus, there is a need to develop a technique for providing low loss optical interconnections over large distances, which addresses both efficiently coupling to individual optical devices, such as silicon photonic chips, and propagating light over distances ranging up to tens of centimeters.

SUMMARY

In one aspect, the disclosed subject matter provides a flexible polymer waveguide array structure that serves as a stitch or jumper on an optical printed circuit board (OPCB). The flexible polymer waveguide array structure can be attached to the OPCB so that it can provide a chip-to-OPCB optical connection.

In one embodiment, the waveguide(s) in the flexible polymer waveguide array structure may be prefabricated before the flexible polymer waveguide array structure is attached to the OPCB. Accordingly, in this embodiment, the flexible polymer waveguide array structure needs to be carefully aligned in the lateral direction with the OPCB waveguides to which they are being optically coupled.

In another embodiment, the waveguide(s) in the flexible polymer waveguide array structure may be fabricated after the flexible polymer waveguide array structure has been attached to the OPCB. The waveguide(s) may be subsequently formed using a printing process such as photolithography. As a consequence of forming the waveguide(s) after attachment of the flexible polymer waveguide array to the OPCB, the precision in the lateral alignment that is required when placing the flexible polymer waveguide array structure on the OPCB is generally significantly less than is required when the waveguide(s) are prefabricated.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

Figure 1:
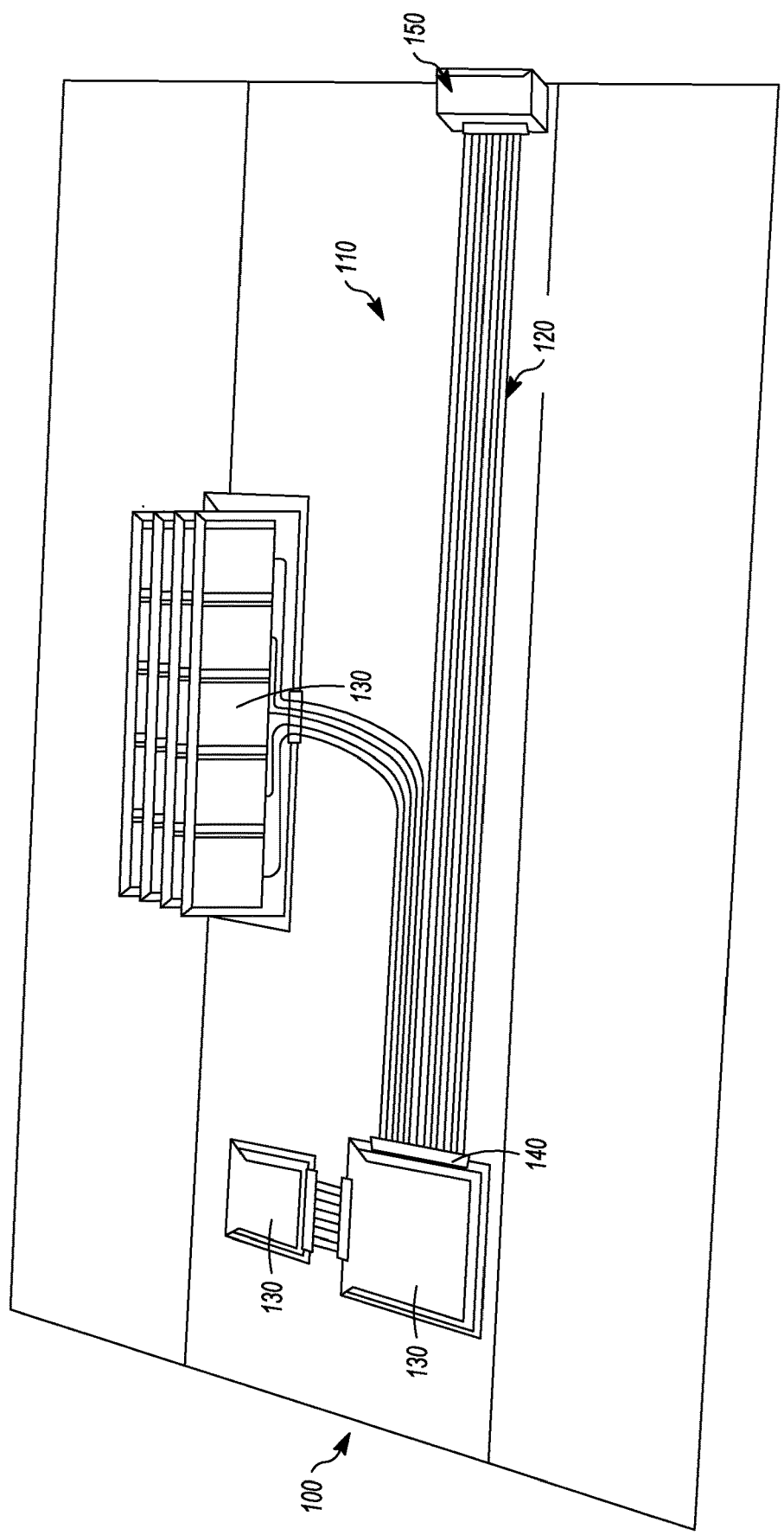
FIG. 1 show a perspective view of one example of an optical printed circuit board (OPCB) on which surface-mounted devices and optical waveguide arrays may be located.

FIG. 1 show a perspective view of one example of an optical arrangement to which the techniques described herein may be applied. The optical arrangement 100 includes a substrate 110 such as an optical printed circuit board (OPCB) that serves as a carrier component. The OPCB 110 has one or more surface areas on which surface mounted devices 130 can be located. Illustrative examples of such surface mounted devices 130 include PICs and other electronic devices (e.g., ASIC, processor, interposer, memory). One or more optical and electrical connectors 150 are provided at the edge of the OPCB 110 to communicate optical and electrical signals between the optical arrangement and external devices and system. The surface mounted devices 130 may be optically interconnected to one another and/or the optical and electrical connectors 150 by a prefabricated array of low loss optical waveguides 120 and electronic circuit traces (not shown) that are formed in the OPCB 110. In one embodiment the optical waveguides 120 are laminate waveguides formed on or in the OPCB 110. In another embodiment the optical waveguides 120 are prefabricated ion exchanged waveguides.

Figure 2:
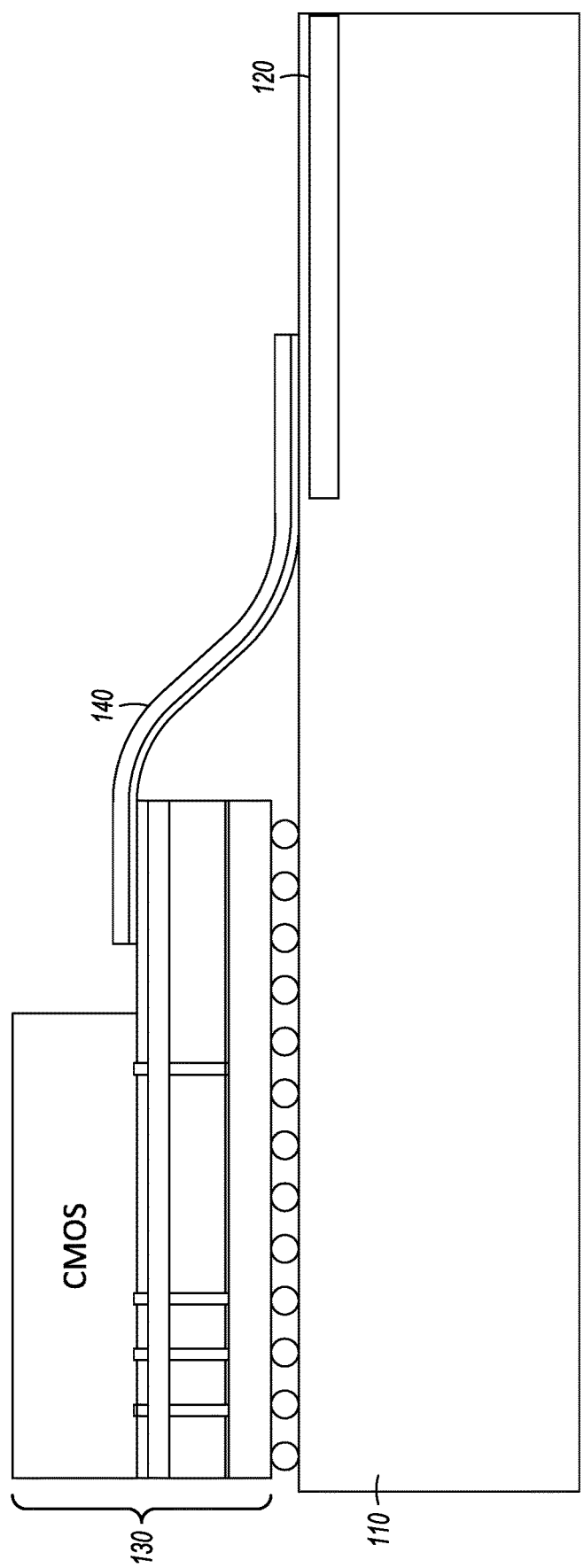
FIG. 2 is a side view of a portion of the optical arrangement shown in FIG. 1.

In accordance with one aspect of the subject matter disclosed herein, optical signals from the surface-mounted devices 130 are connected to the on-board array of waveguides 120 by a short, polymer waveguide array structure 140. The polymer waveguide array structure 140, which is best seen in the side view of an expanded portion of the optical arrangement 100 shown in FIG. 2, may be fabricated in accordance with a number of different techniques.

In one embodiment the polymer waveguide array structure 140 is prefabricated and subsequently secured to the surface mounted device 130 and the OPCB 110. The polymer waveguide array structure 140 may be flexible to facilitate its attachment to components such as the surface mounted device 130 and the OPCB 110, which are typically located in different planes. The polymer waveguide array structure 140 will typically be attached to the top of the OPCB 110, suitably aligned with the underlying OPCB waveguides.

It should be noted that the polymer waveguide array structure 140 is a free-standing, self-supporting (and possibly flexible) structure and is not to be construed as a thin film layer that is itself formed on a free-standing, self-supporting structure.

Figure 3:
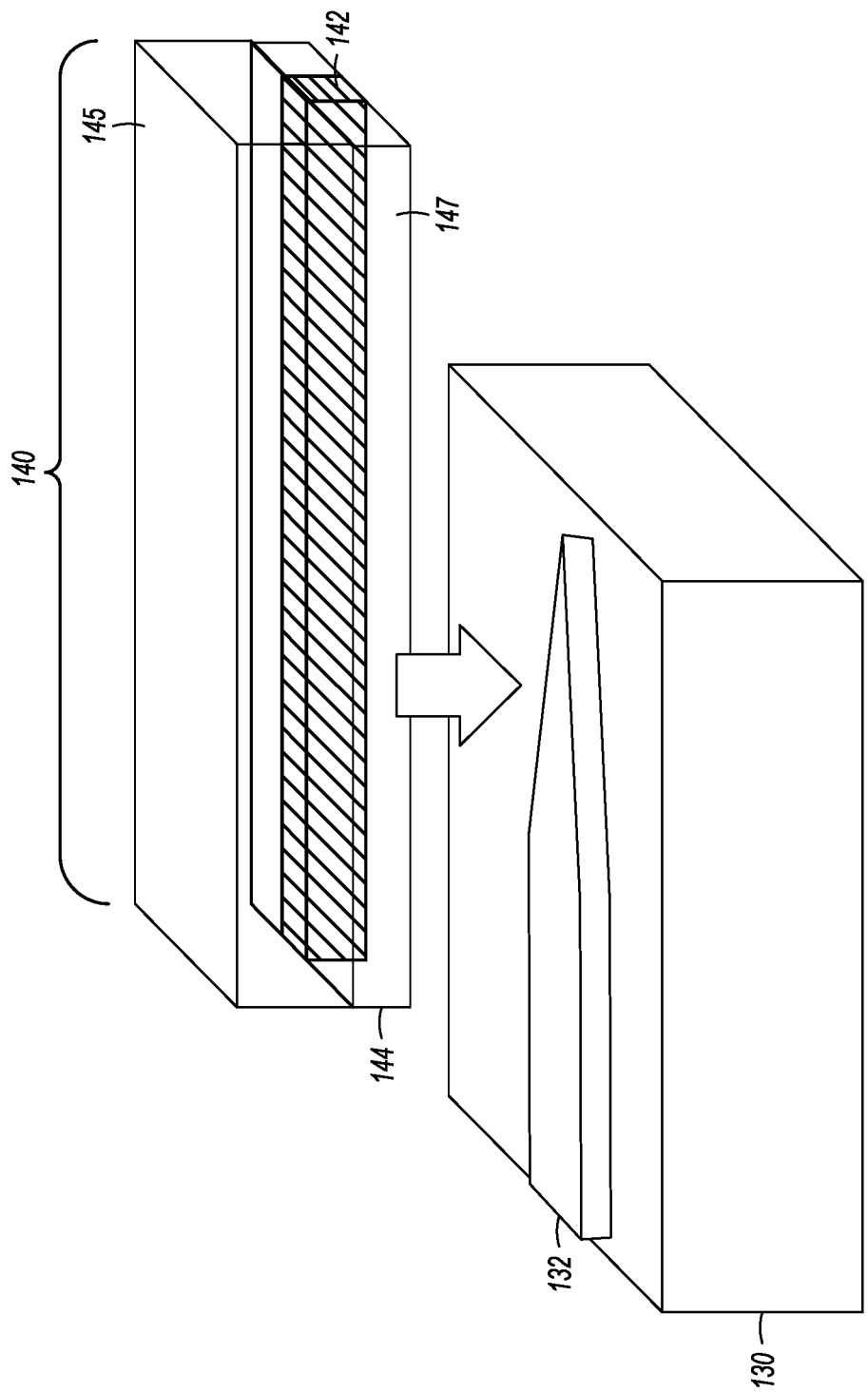
FIG. 3 shows a perspective view of a surface mounted device on which a nano-tapered waveguide is formed to couple optical signals to and from the surface mounted device and the polymer waveguide structure that is to be attached to it.
Figure 4:
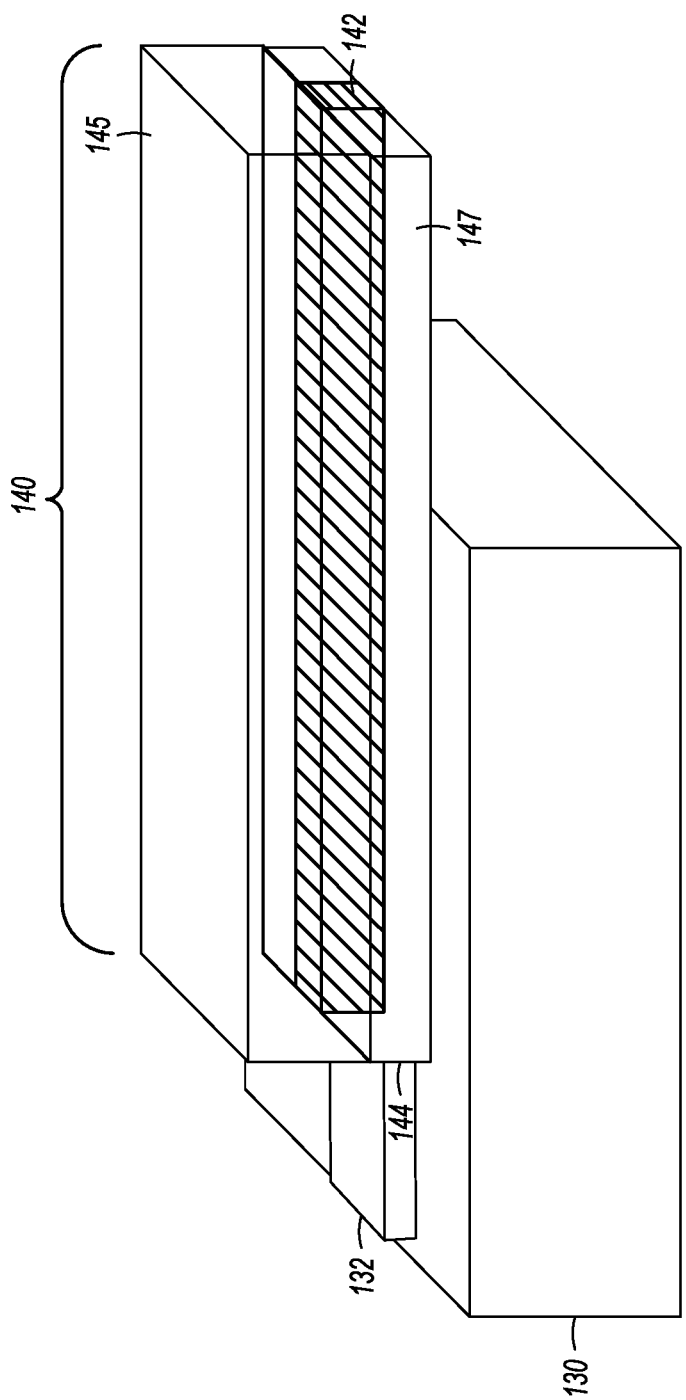
FIG. 4 shows the surface mounted device of FIG. 3 after the polymer waveguide structure has been attached to it.

FIG. 3 shows a perspective view of a surface mounted device 130 on which a nano-tapered waveguide 132 is formed to couple optical signals to and from the surface mounted device 130. FIG. 3 also shows the prefabricated polymer waveguide array structure 140 being placed on the surface mounted device 130 to establish optical coupling between the nano-tapered waveguide 132 and the prefabricated polymer waveguide array structure 140. FIG. 4 shows the polymer waveguide array structure 140 connected to the surface-mounted device 130.

The polymer waveguide array structure 140 includes an array of waveguide cores 142 embedded in a substrate 144. It should be noted that for clarity of illustration the perspective views shown in FIGS. 3 and 4 only illustrate a single polymer waveguide core 142 in the polymer waveguide array structure 140. More generally, however, the polymer waveguide array structure 140 may include any desired number of waveguide cores 142, which would correspond to an equal number of nano-tapered waveguides 132.

The waveguide cores 142 of the polymer waveguide array structure 140 are aligned with the underlying waveguides of the surface-mounted device 130 and the OPCB 110. The polymer waveguide array structure 140 connects to the nano-tapered waveguides 132 on the surface-mounted devices 130 to the on-board array of waveguides 120 with increased lateral placement tolerance. In one embodiment, the required lateral placement precision is expected to be about 3 to 5 microns, for example. The bonding of the polymer waveguide array structure 140 can be performed using an adhesive layer that is provided on the substrate 144, by high temperature treatment combined with pressure, or other techniques.

Figure 5:
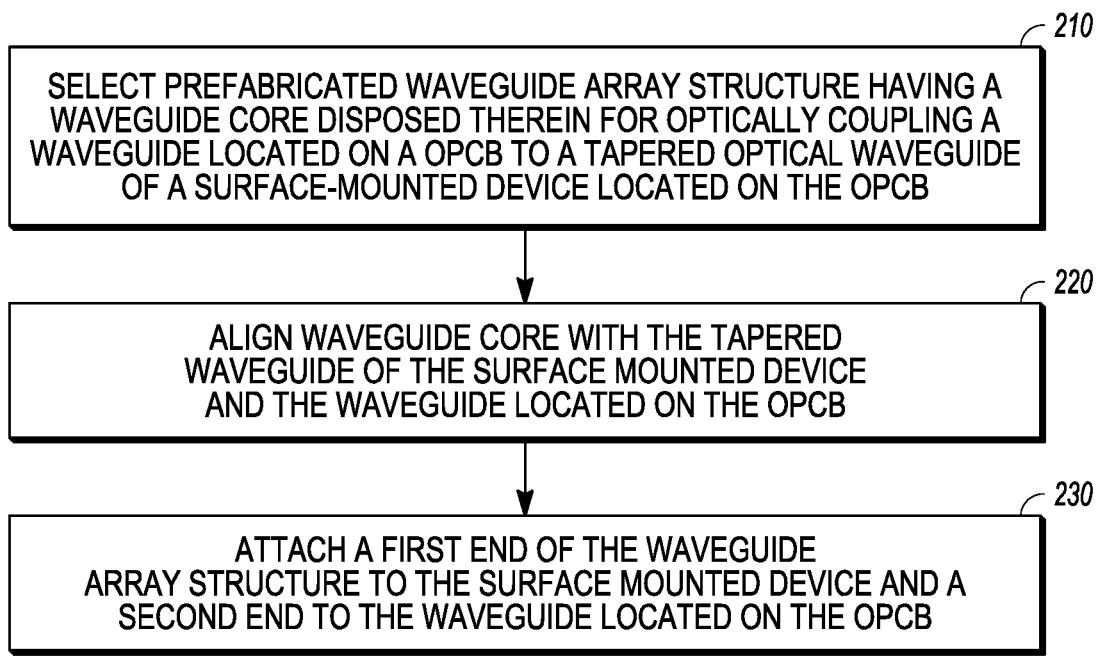
FIG. 5 is a flowchart showing one example of a process for optically coupling one of the waveguides located on the OPCB to the optical waveguide of the surface-mounted device that is surface mounted on the OPCB.

FIG. 5 is a flowchart showing one example of the process described above for optically coupling one of the waveguides 120 located on the OPCB 110 to the tapered optical waveguide 132 of the surface-mounted device 130 that is surface mounted on the OPCB 110. The method begins at block 210 when a suitable prefabricated waveguide array structure 140 having at least one waveguide 142 disposed therein is selected to optically couple the two waveguides 120 and 132. Next, at block 220, the waveguide core 142 in the waveguide array structure 140 is aligned with the tapered waveguide 132 of the surface mounted device 130 and the particular waveguide on the OPCB 110 to which the tapered waveguide 132 is to be coupled. After alignment, a first end of the waveguide array structure 140 is attached to the surface mounted device 130 and a second end to the OPCB 110 at block 230 so that light can be optically coupled between the waveguide 120 and the tapered waveguide 132 via the waveguide core 142 in the waveguide array structure 140. The attachment step may be performed in any suitable manner using e.g., an adhesive or a heat and pressure treatment.

While the example shown in the flowchart of FIG. 5 uses a single prefabricated waveguide core to optically couple a single waveguide on the surface-mounted device to a single waveguide on the OPCB, more generally the prefabricated waveguide array structure may include any number of waveguides to couple an equal number of waveguides on the surface-mounted device to any equal number of waveguides on the OPCB.

In the second embodiment, the substrate 144 of the polymer waveguide array structure 140 is secured to the surface-mounted device 130 and the OPCB 110 before the waveguide cores 142 are fully formed therein. In some cases, illustrated in FIG. 4, the substrate 144 may comprise two or more layers or films. In one embodiment the first or upper layer 145 is generally formed from a flexible, optically transparent material that is relatively thick (e.g., approximately 10-100 microns) so that it can be free-standing and self-supporting. The first layer 145 may also advantageously have a refractive index below that of the finally formed waveguide cores 142 so that it can serve as a cladding. The second or lower layer 147 of the substrate 144 underlies the first layer 145 and initially serves as a slab waveguide if the refractive indices are appropriately chosen. That is, although the second layer 147 can confine light in one direction, perpendicular to the plane of the waveguide, it does not have a predefined core in the lateral directions, parallel to the plane of the waveguide. The second layer 147 is formed from a photosensitive material in which the laterally confining waveguide cores 142 can be defined using, for example, the fabrication process described in U.S. application Ser. No. 15/764,064, which is hereby incorporated by reference in its entirety.

Before the laterally confining waveguide cores 142 are defined in the second layer 147, the substrate 144 (including the first and second layers 145 and 147) is securely fastened to the surface mounted device 130 and the OPCB 110. As in the first embodiment a thin (e.g., about 1-50 nm) adhesive layer may be placed on the substrate 144 to facilitate the fastening of the substrate 144 onto the surface-mounted device 130 and the OPCB 110. The placement of the substrate 144 can be performed using a pick-and-place tool with only rough alignment capabilities. The degree of placement precision that is required in this second embodiment is expected to be much less than that in the first embodiment because it is not necessary to align the nano-tapered waveguides 132 on the surface-mounted devices 130 and the optical waveguide array 120 with the waveguide cores 142 in the substrate 144 since the laterally confining waveguide cores 142 are not fabricated in advance of placement.

After the substrate 144 is securely fastened, a maskless lithographic tool may be used to create the waveguide cores 142. The lithographic tool can utilize a vision system to measure the position of the alignment marks on the surface mounted devices 130 and on the OPCB 110. Based on the locations of the alignment marks, the starting and ending points of the waveguide cores 142 are determined. A pattern to create the waveguide cores 142 is calculated and exposed on the substrate 144 through the optically transparent first layer 145 to create the array of waveguide cores 142 with the lithographic tool. Any of a variety of different polymer materials may be used to form the waveguide cores 142. For example, the material may be SU8. Exposure of SU8 by ultraviolet light, followed by baking (e.g., at 90 C to 170 C) lowers the refractive index of the SU8. Thus, the polymer waveguide cores 142 can be printed directly, without any wet processing, on the substrate 144, with the waveguide cores 142 connecting the surface mounted device 130 to the waveguide array 120 on the OPCB 110 at locations determined by the alignment marks.

Figure 6:
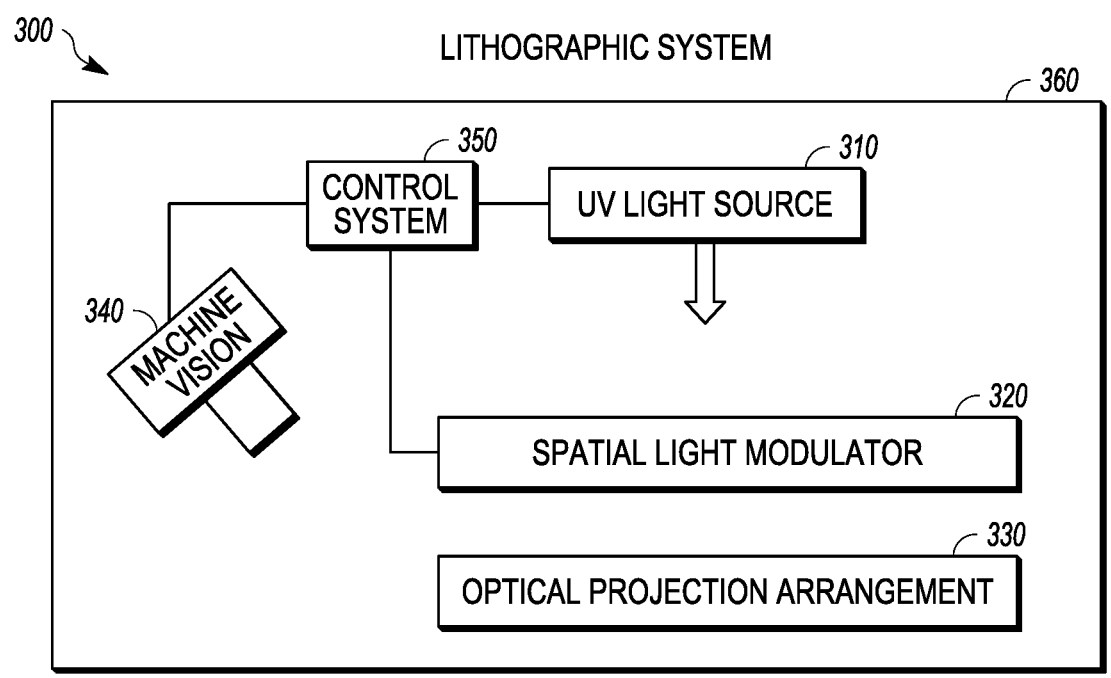
FIG. 6 is a block diagram view of an illustrative maskless lithography system that may be used to form the waveguide cores in the polymer waveguide structure.

FIG. 6 is a block diagram view of an illustrative maskless lithography system 300 that may be used to form the waveguide cores 142. The maskless lithography system 300 includes a light source 310 such as the aforementioned mercury lamp source or ultraviolet laser. The light from the light source 310 is directed to a programmable SLM 320. The programmable SLM 320 is configured to receive image pattern data, also referred to as mask layout data, representative of a desirable lithographic pattern, and direct light representative of the image to an optical projection arrangement 330. The light from the optical projection arrangement 330 then falls onto the photosensitive material in the second layer 147 of the substrate 144. The optical projection arrangement 330 reduces the dimensions of the image received from the programmable SLM 320 and projects the reduced image onto the photosensitive material of the substrate 144.

The lithography system 300 also includes a control system 350 and a vision system 340 to measure the locations on the substrate 144 at which the interconnections are to be made. The vision system 340 may be, by way of illustration, a machine vision camera, a microscope with scanning and stitching capabilities, an x-ray inspection system, or a scanning electron microscope. The control system 350 includes a computer processor, a memory, and a user interface configured to enable a user to input data for instructing the system 300 to produce a printed pattern on the photosensitive second layer of the substrate 144 in which the waveguide core 142 is to be formed. The entire lithographic system 300 is mounted on a scanning stage or robotic arm 360 whose movement over the OPCB 110 is determined by the control system 350 using information obtained from the vision system 350.

The vision system 340 is used to precisely measure the locations of the starting and ending points of the optical cores to be formed in the substrate 144. The control system 350 processes the information from the vision system 340 in real time and converts it to the mask layout data that is be projected onto the photosensitive surface of the substrate. In this way the pattern is projected onto the substrate based on the locations measured by the vision system 340. The pattern may be projected using a sequence of different exposures. In some cases each exposure may form a two-dimensional layer portion of a three-dimensional optical interconnect structure such as a waveguide.

Figure 7:
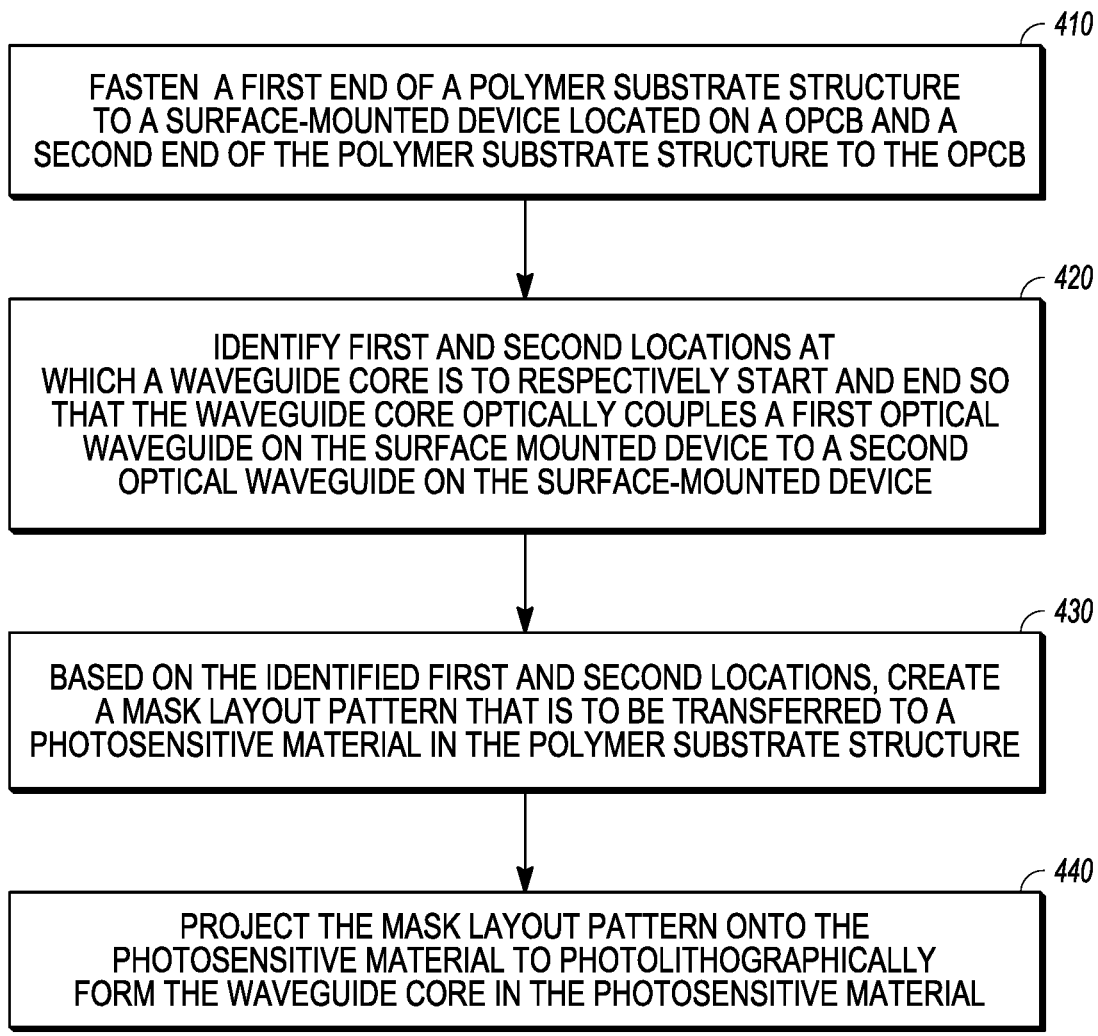
FIG. 7 is a flowchart showing another example of a process for optically coupling one of the waveguides located on the OPCB to the optical waveguide of the surface-mounted device that is located on the OPCB.

FIG. 7 is a flowchart showing one example of the method described above which uses a photolithographic process for optically coupling at least one of the optical waveguides 120 located on the OPCB 110 to a tapered optical waveguide 132 of a surface-mounted device 130 secured to the OPCB 110. The method begins at block 410 when a first end of the polymer substrate 144 is fastened to the surface-mounted device 130 and a second end of the polymer substrate 144 is fastened to the OPCB 110 with an alignment precision that can be significantly less than that required when the waveguide core has been prefabricated. At block 420 first and second locations are identified on the polymer substrate 144 at which the waveguide core 142 is to respectively start and end so that the waveguide core 142 optically couples the optical waveguide 120 to the tapered optical waveguide 132. The locations may be identified using, for example, the vision system 340. Based on the first and second locations that are determined, at block 430 a mask layout pattern is created that is to be transferred to a photosensitive material in the polymer substrate 144. The mask layout pattern is projected onto the photosensitive material at block 440 to photolithographically form the waveguide core 142 in the photosensitive material.

While the example shown in the flowchart of FIG. 7 forms a single waveguide core using a photolithographic technique to optically couple a single waveguide on the surface-mounted device to a single waveguide on the OPCB, more generally any number of waveguide cores may be formed in the polymer substrate to couple an equal number of waveguides on the surface-mounted device to any equal number of waveguides on the OPCB.

Instead of SU8, alternative materials that may be used to form the second layer 147 of the substrate 144 in which the waveguide cores 142 are formed may include, by way of example, ZPU12/ZPU13, Lightlink, Ormocer, acrylate copolymers, EpoCore/EpoClad, SEO 250, MAPTMS/ZPO and RHTi1. Illustrative examples of materials that may be employed for the first layer 145 of the substrate 144 include TPX polymethylpentene, poly(perfluoroalkoxy alkanes) (PFA), poly(ethylene tetrafluoroethylene (ETFE), polystyrene, cellulose, polycarbonate, polydimethylsiloxane (PDMS), polycarbonate and CYCLOTENE™ 3000 & 4000 Series. Ideal properties of the first layer 145 of the substrate 144 include transparency at ultraviolet wavelengths and low loss at signal wavelengths, a lower refractive index compared to the waveguide core material a similar coefficient of thermal expansion to the waveguide core material, durability, flexibility, and conducive to high temperature processing and cycling. Of course, the selected material need not necessarily have all of these properties.

In some embodiments the substrate 144 may be formed from a single photosensitive material, thereby eliminating the need for the first layer 145 described above.

Existing waveguide array structures are optimized primarily for wide latitude in vertical displacement, and, to a lesser degree, lateral displacement. In some embodiments the waveguide in the structure may be designed for wide latitude in lateral displacement. In this way the precision requirement for placement of the waveguide array structure on the OPCB can be reduced.

In one alternative embodiment optical connections can be fabricated using photonic wire bonding such as described in N. Lindenmann et al., "Photonic wire bonding: a novel concept for chip-scale interconnects," Optics Express 20:17667, 2012. This technique utilizes a 3D laser lithography system to expose SU-8 2075 photoresist (Microchem Corp, Westborough Mass.) to create 3D polymer waveguides. High resolution is achieved by two-photon polymerization. However, this process is expected to have relatively low throughput and also potentially suffers from reliability concerns.

It should be noted that large bending of the polymer waveguide array structure 140 can lead to high optical loss. Moreover, in the second embodiment in which the polymer waveguide is formed after the substrate 144 is attached to the OPCB 110, the maximum height difference between the tapered waveguide 132 and the waveguides 120 is limited by the lithographic tool. In one embodiment, the substrate 110 can have a recess, such that the height of the surface mounted devices 110 and the waveguide 132 is close to the height of the waveguide 120. In this case, the bending of waveguide 140 is reduced.

While exemplary embodiments and particular applications of this invention have been shown and described, it is apparent that many other modifications and applications of this invention are possible without departing from the inventive concepts herein disclosed. For example, in some embodiments, instead of a lithographic technique, a direct laser writing technique may be employed in which a scanning laser is used to write the optical interconnect structure in the photosensitive material.

The invention claimed is:

1. A method for optically coupling at least a first waveguide located on an optical printed circuit board (OPCB) to a second optical waveguide of a surface-mounted device surface mounted on the OPCB, comprising:
   providing a flexible waveguide array structure having at least a third waveguide disposed therein;
   attaching a first end of the flexible waveguide array structure to the surface-mounted device for side coupling light between the second and third optical waveguides; and
   attaching a second end of the flexible waveguide array structure to the OPCB for side coupling light between the first optical waveguide and the third optical waveguide, wherein the flexible waveguide array structure includes an adhesive layer for attaching the first and second ends to the surface-mounted device and the OPCB, respectively, and wherein the first waveguide is a tapered waveguide.

2. The method of claim 1, wherein the flexible waveguide array structure is a polymer waveguide array structure.

3. The method of claim 1, wherein attaching the first end of the flexible waveguide array structure to the surface mounted device includes aligning the third waveguide and the second waveguide to establish optical coupling there between and attaching the second end of the flexible waveguide array structure to the OPCB includes aligning the third waveguide and the first waveguide to establish optical coupling there between.

4. The method of claim 1, wherein the surface mounted device is a photonic integrated circuit (PIC).

5. A method for optically coupling at least a first waveguide located on an optical printed circuit board (OPCB) to a second optical waveguide of a surface-mounted device surface mounted on the OPCB, comprising:
   providing a flexible substrate structure configured as a slab waveguide to confine light in a first direction;
   attaching a first end of the flexible substrate structure to the surface-mounted device; and
   attaching a second end of the flexible substrate structure to the OPCB; and
   subsequent to attaching the first and second ends of the flexible substrate structure, forming at least a third optical waveguide in the flexible substrate structure using a direct write process so that light can be (i) confined in a lateral direction perpendicular to the first direction as well as in the first direction and (ii) side coupled between the second and third waveguides and side coupled between the first and third optical waveguides, wherein the first waveguide is a tapered waveguide.

6. The method of claim 5, wherein the flexible substrate structure includes a photosensitive material and forming said at least third optical waveguide includes photolithographically forming said at least third optical waveguide.

7. The method of claim 6, wherein the flexible substrate structure further comprises an optically transparent supporting layer on which the photosensitive material is located.

8. The method of claim 7, wherein the optically transparent supporting layer has a refractive index lower than that of the photosensitive material.

9. The method of claim 5, wherein said at least first, second and third waveguides each comprise a waveguide array.

10. The method of claim 5, wherein the surface mounted device is a photonic integrated circuit (PIC).

11. The method of claim 5 wherein the flexible substrate structure includes a plurality of optical layers, an underlying one of the plurality of optical layers serving as the slab waveguide confining light in the first direction and an overlying one of the plurality of optical layers serving as a cladding layer, the third waveguide being formed in the underlying one of the plurality of optical layers.

12. An optical arrangement, comprising:
   an optical printed circuit board (OPCB) having at least a first optical waveguide formed therein;
   at least one surface-mounted device mounted to the OPCB, the surface-mounted device including at least a second optical waveguide, wherein the second waveguide is a tapered waveguide; and
   a flexible waveguide array structure having at least a third waveguide disposed therein, a first end of the flexible waveguide array structure being surface mounted to the surface-mounted device for side coupling light between the second and third optical waveguides and a second end of the flexible waveguide array structure being surface mounted to the OPCB for side coupling light between the first optical waveguide and the third optical waveguide, wherein the flexible waveguide array structure includes an adhesive layer securing the first and second ends to the surface mounted device and the OPCB, respectively.

13. The optical arrangement of claim 12, wherein the flexible waveguide array structure is a polymer waveguide array structure.

14. The optical arrangement of claim 12, wherein the flexible substrate structure includes a photosensitive material and said at least third optical waveguide is a photolithographically formed optical waveguide.

15. The optical arrangement of claim 14, wherein the flexible substrate structure further comprises an optically transparent supporting layer on which the photosensitive material is located.

16. The optical arrangement of claim 15, wherein the optically transparent supporting layer has a refractive index lower than that of the photosensitive material.

17. The optical arrangement of claim 12, wherein said at least first, second and third waveguides each comprise a waveguide array.

18. The optical arrangement of claim 12, wherein the surface mounted device is a photonic integrated circuit (PIC).

19. A method for optically coupling at least a first optical waveguide located on an optical printed circuit board (OPCB) to a second optical waveguide of a surface-mounted device surface mounted on the OPCB, comprising:
- fastening a first end of a polymer substrate structure to a surface-mounted device located on the OPCB, the polymer substrate structure being configured as a slab waveguide to confine light in a first direction;
- fastening a second end of the polymer substrate structure to the OPCB;
- determining first and second locations at which a waveguide core is to respectively start and end so that the waveguide core optically side couples the first optical waveguide to the second optical waveguide, wherein the first optical waveguide is a tapered optical waveguide;
- based on the identified first and second locations, creating a mask layout pattern that is to be transferred to a photosensitive material in the polymer substrate structure; and
- projecting the mask layout pattern onto the photosensitive material to photolithographically form the waveguide core in the photosensitive material so that the waveguide core is configured to confine light in a lateral direction perpendicular to the first direction as well as in the first direction.

20. The method of claim 19 wherein the polymer substrate structure includes a plurality of optical layers, an underlying one of the plurality of optical layers serving as the slab waveguide confining light in the first direction and an overlying one of the plurality of optical layers serving as a cladding layer, the third waveguide being formed in the underlying one of the plurality of optical layers.

21. The method of claim 19, wherein determining the first and second locations at which the waveguide core is to respectively start and end is performed by a machine vision system.

* * * * *